(12) United States Patent
Chakrapani et al.

(10) Patent No.: US 12,287,362 B2
(45) Date of Patent: Apr. 29, 2025

(54) SYSTEMS AND METHODS FOR IDENTIFYING GRID FAULT TYPE AND FAULTED PHASE

(71) Applicant: General Electric Technology GmbH, Baden (CH)

(72) Inventors: Venkatesh Chakrapani, Stafford (GB); Ilia Voloh, Thornhill (CA)

(73) Assignee: GE Infrastructure Technology LLC, Greenville, SC (US)

( * ) Notice: Subject to any disclaimer, the term of this patent is extended or adjusted under 35 U.S.C. 154(b) by 109 days.

(21) Appl. No.: 18/053,183

(22) Filed: Nov. 7, 2022

(65) Prior Publication Data

US 2024/0151762 A1 May 9, 2024

(51) Int. Cl.
*G01R 31/08* (2020.01)
*G06Q 50/06* (2024.01)

(52) U.S. Cl.
CPC ........... *G01R 31/086* (2013.01); *G06Q 50/06* (2013.01)

(58) Field of Classification Search
CPC ...... G01R 31/086; G01R 31/52; G01R 31/50; G01R 31/58; G01D 2204/22
See application file for complete search history.

(56) References Cited

U.S. PATENT DOCUMENTS

| | | | |
|---|---|---|---|
| 4,148,087 A * | 4/1979 | Phadke | H02H 3/387 361/81 |
| 5,515,227 A | 5/1996 | Roberts et al. | |
| 6,525,543 B1 | 2/2003 | Roberts et al. | |
| 9,442,152 B2 * | 9/2016 | Wu | G01R 31/086 |
| 10,197,614 B2 * | 2/2019 | Benmouyal | G01R 31/085 |
| 10,288,688 B2 * | 5/2019 | Kasztenny | H02H 7/06 |
| 10,859,639 B2 | 12/2020 | Kasztenny | |

(Continued)

FOREIGN PATENT DOCUMENTS

EP 3703209 A1 9/2020

OTHER PUBLICATIONS

Medhat et al.: Triple Current Control of Four-Wire Inverter-Interfaced DGs for Correct Fault Type Identification. IEEE Transactions on Smart Grid, vol. 13, No. 5, pp. 3607-3618, Sep. 2022.

(Continued)

*Primary Examiner* — Reena Aurora
(74) *Attorney, Agent, or Firm* — Eversheds Sutherland (US) LLP

(57) ABSTRACT

A system for detecting a fault type and faulted phase in a power grid includes a controller and a relay. The relay is configured to monitor a line of the power grid and generate a monitoring signal. The controller may be configured to determine, in response to the monitoring signal received from the relay, sequence voltages and sequence currents in the line. The controller may further determine, in response to the sequence voltages and sequence currents, an absence or a presence of a weak-infeed condition in the line. The controller may further determine, in response to the monitoring signal and the absence or the presence of the weak-infeed condition, a first plane sequence signature and a second plane sequence signature. The controller may further determine a fault type and faulted phase in the power grid in response to the first plane sequence signature and the second plane sequence signature.

20 Claims, 4 Drawing Sheets

(56) References Cited

U.S. PATENT DOCUMENTS

| | | |
|---|---|---|
| 11,307,264 B2 | 4/2022 | Guzman-Casillas et al. |
| 2022/0308103 A1 | 9/2022 | Kasztenny |

OTHER PUBLICATIONS

Kasztenny et al.: Phase Selection for Single-Pole Tripping: Weak Infeed Conditions and Cross-Country Faults. l27th Annual Western Protective Relay Conference, Oct. 2000, 22 pp.

\* cited by examiner

SYSTEMS AND METHODS FOR IDENTIFYING GRID FAULT TYPE AND FAULTED PHASE

TECHNICAL FIELD

The present disclosure relates to power grids, and in particular, to systems and methods for identifying fault type and faulted phase in power grids.

BACKGROUND

A power grid includes a network of stations and lines connecting these stations, used to transmit power from one or more energy sources for consumption at various locations. Power grids typically employ a three-phase system to transmit electric power compared to single-phase or direct current systems. Changing external conditions or internal conditions within components of the grid may cause faults. For example, the faults may include shorts, grounding, arcing, surges, or the like and involving one or more phases.

Relays may be used to protect against faults, for example, by conducting a protective action in response to faults. For example, a relay may open all three phases of the line or a single phase of a line for a predetermined period of time, and then reclose all phases of the line or just single phase.

SUMMARY

The present disclosure relates to identifying fault types in power grids, and in particular, to systems and methods for identifying fault type and faulted phase in a power grid including a renewable energy source. A relay may then perform a protective action based on the fault type and the faulted phase.

In embodiments, the present disclosure describes a system for detecting a fault type and faulted phase in a power grid including a relay. The relay is configured to monitor a line of the power grid and generate a monitoring signal, indicating presence of a line fault. The relay may include a controller. The controller may be configured to determine, in response to the monitoring signal received from the relay, sequence voltages and sequence currents in the line. The controller may be further configured to determine, in response to the sequence voltages and sequence currents, an absence or a presence of a weak-infeed condition in the line. The controller may be further configured to determine, in response to the monitoring signal and the absence or the presence of the weak-infeed condition, a first plane sequence signature and a second plane sequence signature. The controller may be further configured to determine a fault type and faulted phase in the power grid in response to the first plane sequence signature and the second plane sequence signature.

In embodiments, the present disclosure describes a method for detecting a fault in a power grid including a relay. The method may include determining, by a controller, in response to the monitoring signal received from the relay, sequence voltages and sequence currents in the line. The method may further include determining, by the controller, in response to the sequence voltages and sequence currents, an absence or a presence of a weak-infeed condition in the line. The method may further include determining, by the controller, in response to the monitoring signal and the absence or the presence of the weak-infeed condition, a first plane sequence signature and a second plane sequence signature. The method may further include determining, by the controller, a fault type and faulted phase in the power grid in response to the first plane sequence signature and the second plane sequence signature.

Additional systems, methods, apparatus, features, and aspects can be realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

Having thus described the disclosure in general terms, reference will now be made to the accompanying drawings, which are not necessarily drawn to scale.

Figure 1:
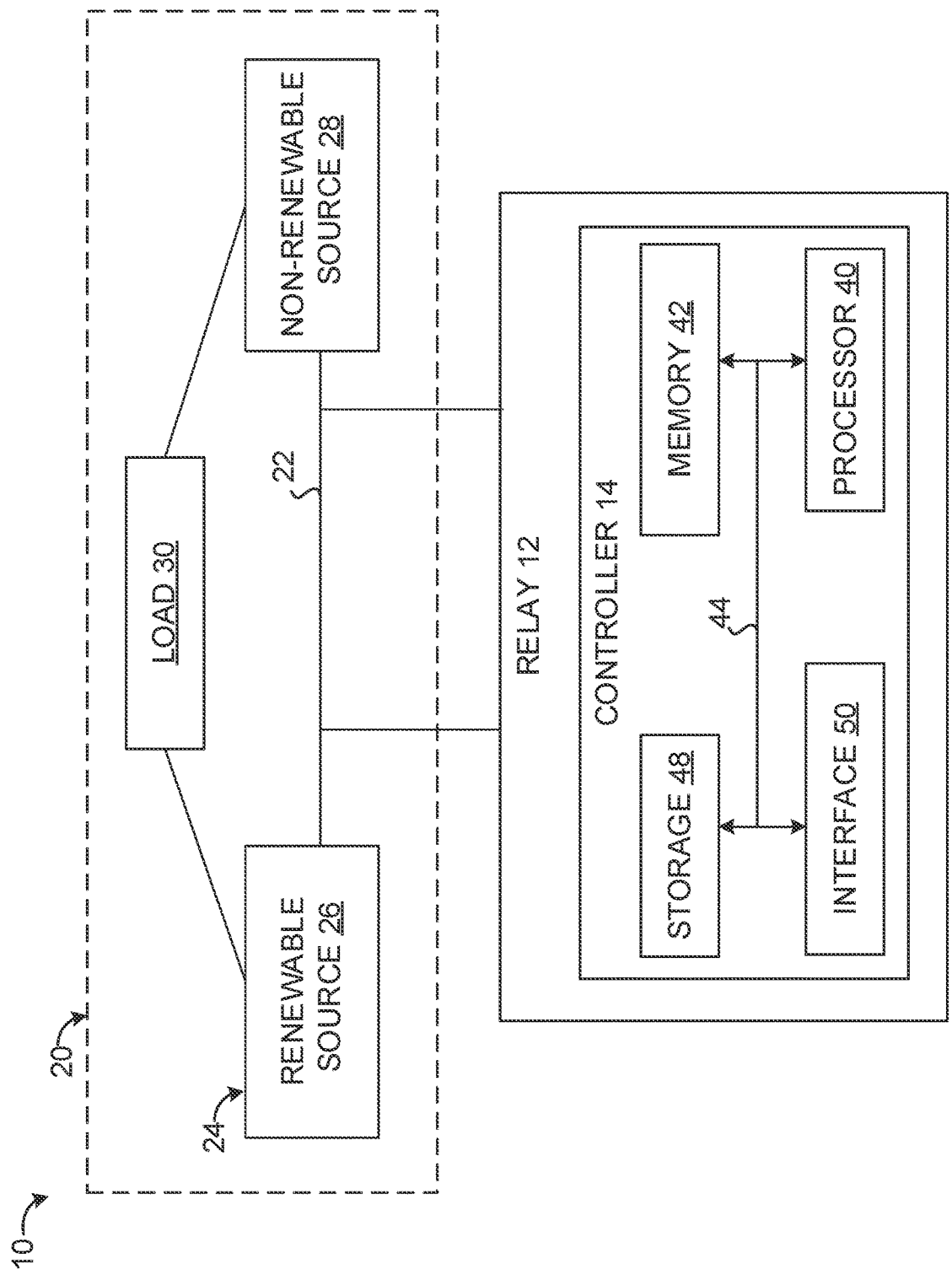

FIG. 1 is a block diagram showing a system including a relay and a controller for detecting faults in a power grid.

Figure 2:
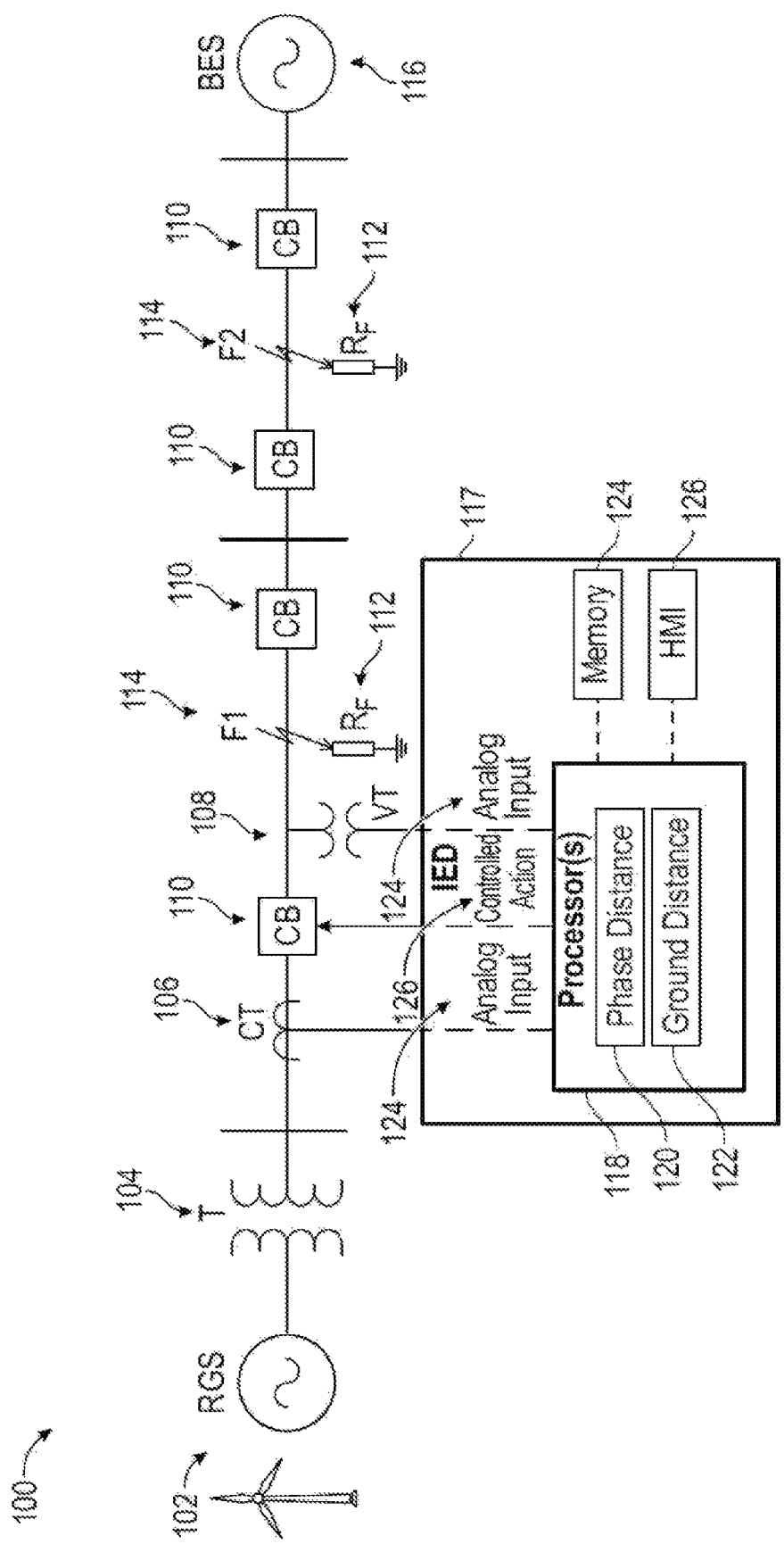

FIG. 2 depicts a schematic illustration of an example system, in accordance with one or more example embodiments of the disclosure.

Figure 3:
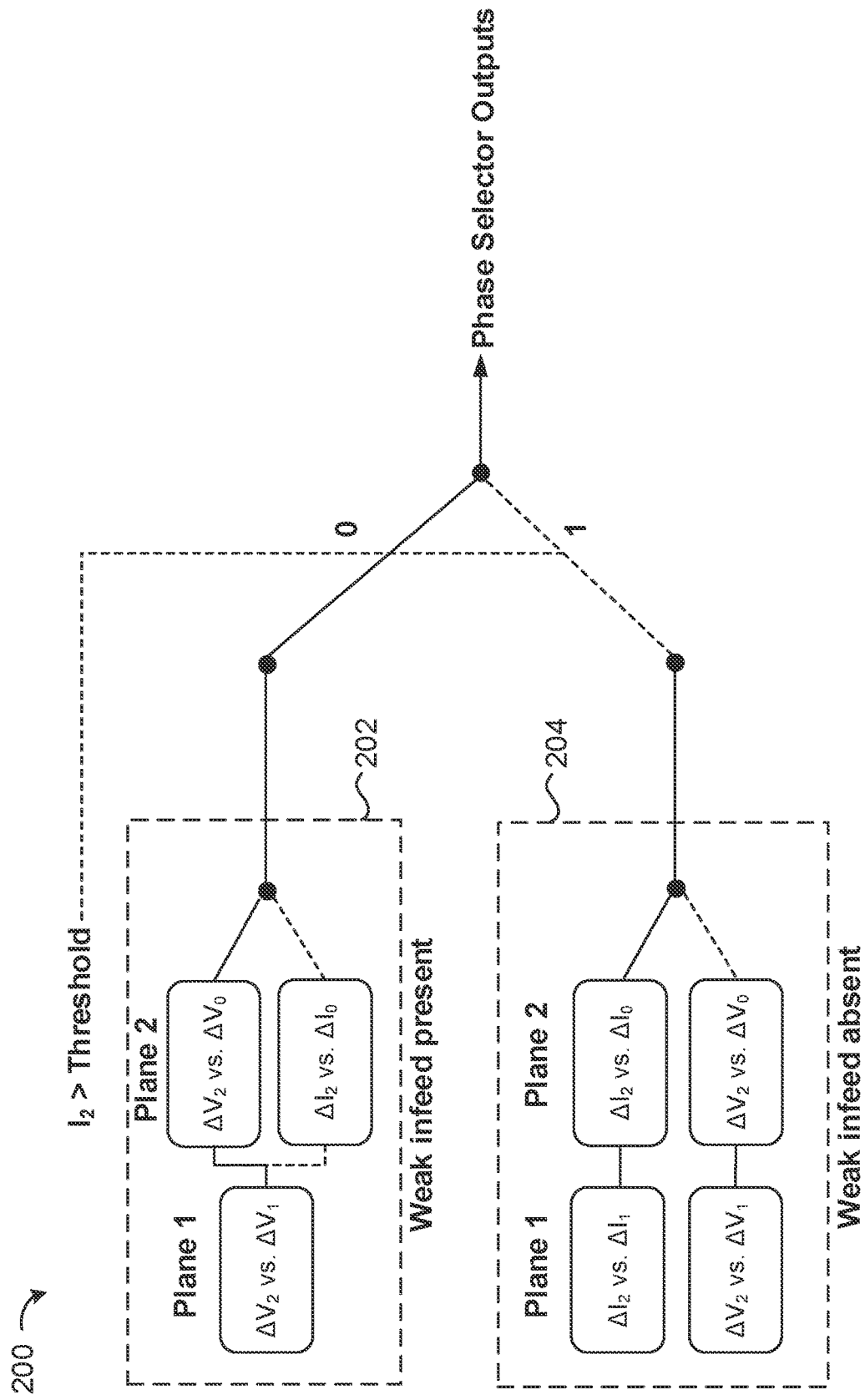

FIG. 3 is a block diagram showing sequence quantities used to detect fault type and faulted phase.

Figure 4B:
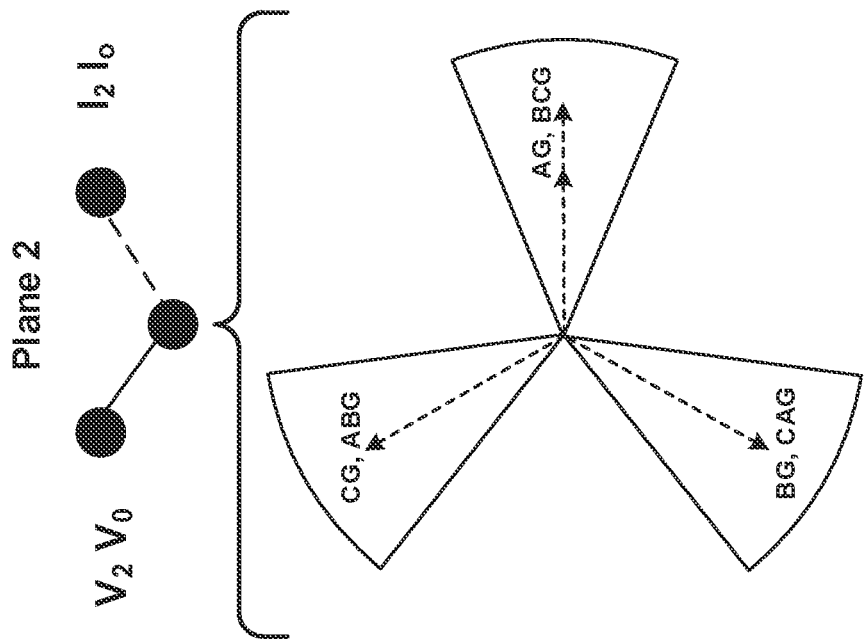
Figure 4A:
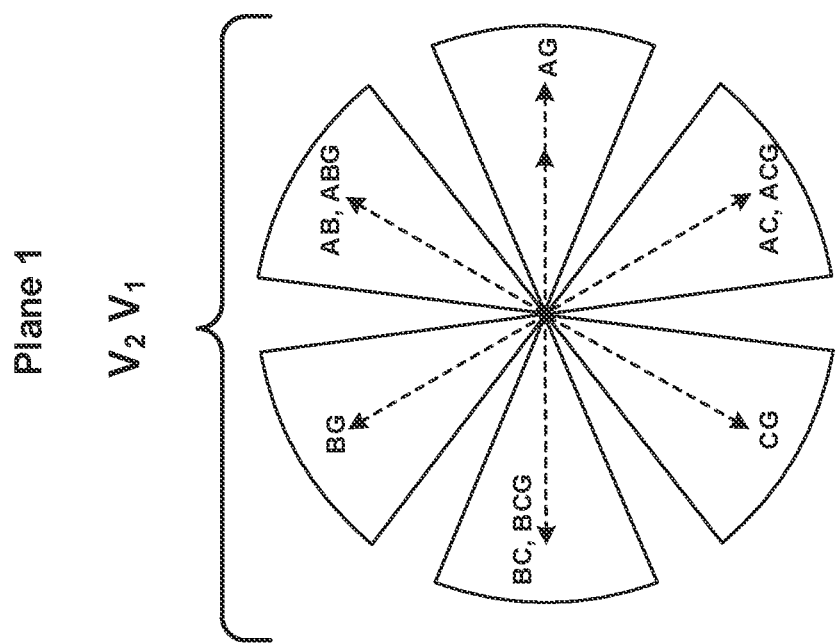

FIG. 4A is a chart showing a fault pattern for different faulted phases in a first plane based on a positive sequence and a negative sequence.

FIG. 4B is a chart showing a fault pattern for different faulted phases in a second plane based on a zero sequence and a negative sequence.

Embodiments of the disclosure are described more fully below with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the present disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the present disclosure. However, it will be apparent that the present disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

DETAILED DESCRIPTION

The present disclosure relates to power grids, and in particular, to systems and methods for identifying faults, in particular, fault type and faulted phase in power grids. A power grid may include a network of stations and lines connecting these stations, with nodes representing power sources or loads, and lines representing connections between the stations.

In embodiments, the present disclosure describes a system for detecting a fault type and faulted phase in a power grid including a controller and a relay. The relay is configured to monitor a line of the power grid and generate a monitoring signal. The controller is configured to determine, in response to the monitoring signal, first and second plane sequence signatures (based on positive, negative, or zero sequence quantities), which are ultimately used to detect fault type and faulted phase.

Identification of fault type and faulted phase in a power grid plays a key role not only for a fault locator or supervision of the distance function phase loops, but also for single pole tripping to correctly identify the faulted phase, thereby improving the stability limits. This fault type and faulted phase identification may be performed by a phase selector element. With growing use of renewable energy as part of power grids, existing phase selectors may not able to correctly identify the fault type and faulted phase due to the fault current limitation and the control strategy used in inverter-based resources. Systems and methods according to the present disclosure can correctly identify fault type and faulted phase using sequence voltages and sequence currents.

For example, the controller may determine, based on the monitoring signals received from the relay, sequence voltages and sequence currents in the line. The controller may be further configured to determine, in response to the acquired voltages and sequence currents, an absence or a presence of a weak-infeed condition in the line. The controller may be further configured to determine, in response to the monitoring signal and the absence or the presence of the weak-infeed condition, a first plane sequence signature and a second plane sequence signature. The controller may be further configured to determine a fault type in the power grid in response to the first plane sequence signature and the second plane sequence signature.

Systems and methods according to the present disclosure may not need additional hardware beyond that already present in power grid infrastructure. Further, no additional communication may be needed. Systems and methods according to the present disclosure may not need directional information to identify the fault type and faulted phase. Further, in relying on information from two planes, there may be greater security in detecting single line-to-ground faults. Moreover, the present systems and methods are not time limited, like traveling wave, or otherwise based on incremental quantities where the information is available only for certain durations. Such independence may be helpful in case of overreaching distance zones or pilot schemes. The present systems and methods may provide dynamic switch between sequence delta voltages, sequence delta currents, in determining fault type and faulted phase, depending on conditions in the power grid.

In three-phase grids, a symmetrical components analysis may be used to detect faults. For example, a three-phase voltage phasor may be resolved into positive, negative, and zero sequence components, typically denoted by the subscript 1, 2, and 0. Thus, for three-phase voltage phasors $V_A$, $V_B$, and $V_C$, each phasor may be resolved into a positive, negative, and zero sequence component (for example, $V_{A1}$, $V_{A2}$, $V_{A0}$, $V_{B1}$, $V_{B2}$, $V_{B0}$, $V_{C1}$, $V_{C2}$, and $V_{C0}$). Likewise, current phasors $I_A$, $I_B$, and $I_C$ may be resolved into a positive, negative, and zero sequence components (for example, $I_{A1}$, $I_{A2}$, $I_{A0}$, $I_{B1}$, $I_{B2}$, $I_{B0}$, $I_{C1}$, $I_{C2}$, and $I_{C0}$). The present disclosure describes using combinations of these components in determining fault type and phase.

While fault detection using certain symmetrical components may be used, for example, to operate or trigger protective relay functions, certain faults during certain conditions can lead to uncharacteristic changes in particular sequence components, making detection difficult. For example, in a weak infeed condition arising from a fault may not provide a sufficient current-based component to trigger a relay function that relies primarily on current-detection. Systems and methods according to the present disclosure use different combinations of sequence combinations under different infeed conditions.

In embodiments, when a controller does not detect weak-infeed conditions in the grid, a phase selector decision (for example, for identifying a faulted phase or fault type) may be based on a first plane decision (delta positive sequence current and delta negative sequence current) and a second plane decision (delta zero sequence current and delta negative sequence current). When a decision cannot be made using such sequence information, the first plane decision may instead be based on delta positive sequence voltage and delta negative sequence voltage, and the second plane decision may be based on delta zero sequence voltage and delta negative sequence voltage.

In embodiments, when the controller detects weak-infeed conditions, the phase selector decision (for example, for identifying a faulted phase or fault type) may be based on a first plane decision (delta positive sequence voltage and delta negative sequence voltage) and a second plane decision (delta zero sequence voltage and delta negative sequence voltage). When a decision cannot be made using such sequence information, the first plane decision may be retained, while the second plane decision may then be based on the delta zero sequence current and delta negative sequence current.

Thus, depending on whether weak infeed is detected, a first decision attempt is made based on certain combinations of sequence components (to identify a fault). If that decision cannot be made, alternative combinations of sequence components may be used.

The faults may typically include single line-to-ground faults (where only one of the three phases is shorted to the ground), line-to-line faults (where two of the three phases are shorted with each other), line-to-line-to-ground (where two of the three phases are shorted with each other and ground), and three-phase faults (all phases shorted to each other or to ground).

FIG. 1 is a block diagram showing a system 10 including a relay 12 including a controller 14 for detecting faults in a power grid 20. The power grid 20 may include one, two, or more power sources, interconnected by lines. Thus, the power grid 20 may include a network of lines 22 connecting nodes 24. In embodiments, the power grid 20 may include at least one renewable source 26, for example, at a node 24. The power grid 20 may also include at least non-renewable source 28, or at least one load 30 (for example, a customer or user of power drawn from the grid). A fault may be associated with one or more nodes or lines.

The relay 12 may be configured to mitigate the fault, for example, initially break or open a line or a phase when a fault is detected, and then close the line or phase after the fault is no longer present. While the relay 12 and the controller 14 are described and shown as different components, in some embodiments, the functions described with reference to the controller 14 may be performed by the relay 12, and one or more components described with reference to the controller 14 may be present in the relay 12.

The relay 12 is configured to monitor at least the line 22 of the power grid 20 and generate a monitoring signal. The relay 12 may send the monitoring signal to the controller 14 via a wired or wireless connection. The controller 14 may be configured to determine, in response to the monitoring signal received from the relay 12, sequence voltages and sequence currents in the line 22. For example, the controller 14 may determine one or more sequence components (positive, negative or zero sequences) of voltage and/or current. The controller 12 may be further configured to determine, in response to the sequence voltages and sequence currents, an absence or a presence of a weak-infeed condition in the line.

The controller 12 may be further configured to determine, in response to the monitoring signal and the absence or the presence of the weak-infeed condition, a first plane sequence signature and a second plane sequence signature. The controller may be further configured to determine a fault type and faulted phase in the power grid 20 (for example, in line 22, or in nodes 26 or 28 connected by line 22) in response to the first plane sequence signature and the second plane sequence signature.

In embodiments, the first plane sequence signature may include positive and negative sequences. The second plane sequence signature may include zero and negative sequences. The sequences may be voltage or current sequences. The fault type and faulted phase may be determined based on the angle in a phase diagram associated with a pair of sequence components for each of two planes.

In embodiments, the controller 14 is further configured to, in response to the absence of the weak-infeed condition, determine the first plane sequence signature including a first plane current sequence signature based on a delta positive-sequence current and a delta negative-sequence current ($\Delta I_1$ and $\Delta I_2$). Further, the controller 14 may determine the second plane sequence signature including a second plane current signature based on a delta zero-sequence current and the delta negative-sequence current ($\Delta I_0$ and $\Delta I_2$). Thus, the controller 14 may ultimately initially determine a fault type and faulted phase based on an $I_1$-$I_2$ plane and $I_0$-$I_2$ plane. In some conditions, it may not be possible for the controller to determine the fault based on these planes of sequence components. For example, the magnitude associated with one of these planes may be weak, inaccurate, or unavailable, or the detected fault may not conform to other conditions detected in the power grid.

The controller 14 may be further configured to, in response to failure to determine the fault based on the first plane current signature ($\Delta I_1$ and $\Delta I_2$) and the second plane current signature ($\Delta I_0$ and $\Delta I_2$), determine the fault type and faulted phase based on a first plane voltage sequence signature based on a delta positive-sequence voltage and a delta negative-sequence voltage ($\Delta V_1$ and $\Delta V_2$) and a second plane voltage sequence signature based on a delta zero-sequence voltage and the delta negative-sequence voltage ($\Delta V_0$ and $\Delta V_2$). Thus, even if an initial fault detection is not successful, the controller 14 may use these alternative plane sequence signatures to determine the fault condition.

Turning to the presence of weak-infeed condition, the controller 14 may use somewhat different combinations of sequence components. For example, the controller 14 may determine the first plane signature including a first plane voltage signature based on a delta positive-sequence voltage and a delta negative-sequence voltage ($\Delta V_1$ and $\Delta V_2$). The controller 14 may further determine the second plane signature including a second plane voltage signature based on a delta zero-sequence voltage and the delta negative-sequence voltage ($\Delta V_0$ and $\Delta V_2$). Using the voltage sequence instead of current sequences may overcome the deficiencies arising from an inability to detect a weak current.

Again, if this combination of sequence components is not successful, the controller 14 can use an alternative combination of sequences. For example, the controller 14 may be further configured to, in response to failure to determine the fault type and faulted phase based on the first plane voltage signature ($\Delta V_1$ and $\Delta V_2$) and the second plane voltage signature ($\Delta V_0$ and $\Delta V_2$), determine the fault based on the first plane voltage sequence signature ($\Delta V_1$ and $\Delta V_2$) and a second plane current sequence signature based on a delta zero-sequence current and the delta negative-sequence current ($\Delta I_0$ and $\Delta I_2$). Thus, the first plane voltage sequence signature remains in use, with only the second plane signature now being based on a current sequence instead of a voltage sequence.

The fault may include one or more of a single line-to-ground fault, a line-to-line fault, a line-to-line-to-ground fault, or a three-phase fault.

The controller 14 may be configured to control the relay 12 to perform a protective function based on the fault. The protective function may include controlling, such as switching, a breaker or other power transmission equipment associated with a transmission line. In embodiments, the relay 12 may only transiently open a single phase in response to a single line-to-ground fault associate with arcing, which may be self-extinguished. Alternatively, the relay 12 may open one or more phases indefinitely in response to a major fault, and the relay 12 may not close those phases unless a "reset" signal is sent by the controller 14 to the relay 12. The reset signal may be initiated by maintenance personnel after maintenance or inspection is complete, or based on certain criteria, for example, time-based, current-based, voltage-based or other criteria.

FIG. 2 illustrates an example system 100 according to an embodiment of the disclosure. In some embodiments, the system 100 may include one or more renewable power generation source(s) 102, one or more current transformer(s) 106, one or more voltage transformer(s) 108, one or more step-up transformers 104, one or more circuit breaker(s) 110, and one or more bulk electrical systems 116. Additionally, there may exist one or more line fault(s) 114 in the system 100, which may be associated with one or more fault resistance(s) 112. In some cases, the system 100 may also include an intelligent electronic device (IED) 117. The IED may include one or more processor(s) 118, which may be used for phase distance 120 and ground distance 122 calculations. The IED 117 may also include memory 124 and/or a human-machine interface (HMI) 126. The IED 117 (as well as any other element included in the system 100) may also include any elements described with respect to the relay 12 or the controller 14 of FIG. 1.

FIG. 3 is a block diagram showing a fault detection scheme 200. The first block 202 is associated with the presence of a weak infeed. In the presence of a weak infeed, the controller 14 may initially determine a first plane (plane 1) signature based on a change in negative-sequence voltage and positive-sequence voltage ($\Delta V_2$ vs. $\Delta V_1$), and a second plane (plane 2) signature based on a change in negative-sequence voltage and zero-sequence voltage ($\Delta V_2$ vs. $\Delta V_0$). If that determination is unsuccessful, for example, because of an unavailability, low magnitude, or noise associated with those components, then the controller may then determine alternative first and second plane signatures. For example, the controller 14 may retain the first plane (plane 1) signature based on a change in negative-sequence voltage and positive-sequence voltage ($\Delta V_2$ vs. $\Delta V_1$), but use an alternative second plane (plane 2) signature based on a change in negative-sequence current and zero-sequence current ($\Delta I_2$ vs. $\Delta I_0$). In both cases, the first plane is based on a negative-positive sequence combination, while the second plane is based on a negative-zero sequence combination.

The second block 204 is associated with the absence of a weak infeed. In the absence of a weak infeed, the controller 14 may initially determine the first plane (plane 1) signature based on a change in negative-sequence current and positive-sequence current ($\Delta I_2$ vs. $\Delta I_1$), and the second plane (plane 2) signature based on a change in negative-sequence current and zero-sequence current ($\Delta I_2$ vs. $\Delta I_0$). If that determination is unsuccessful, for example, because of an unavailability, low magnitude, or noise associated with those components, then the controller may then determine alternative first and second plane signatures. For example, the controller 14 may use an alternative first plane (plane 1) signature based on a change in negative-sequence voltage and positive-sequence voltage ($\Delta V_2$ vs. $\Delta V_1$), and an alternative second plane (plane 2) signature based on a change in negative-sequence voltage and zero-sequence voltage ($\Delta V_2$ vs. $\Delta V_0$). In both cases, the first plane is based on a negative-positive sequence combination, while the second plane is based on a negative-zero sequence combination—however, unlike in the weak infeed present case (block 102), it is the current sequence components that are initially used before turning to voltage sequence components.

Based on the logic shown in FIG. 3, the controller 14 may control the relay 12 to select certain phases.

FIG. 4A is a chart showing a fault pattern for different faulted phases in a first plane based on a positive sequence and a negative sequence. In FIG. 4A, different zones in the first plane phase diagram ($\Delta V_2$-$\Delta V_1$) are associated with different faults. Thus, depending on the angle of the detected signal, the possible fault can be identified as one associated with that zone. Now, if the angle is not in any particular zone, but in between zones, then the fault type cannot be detected. This is another example where the controller may need to use an alternative combination of sequence signatures if an initial combination of sequence signatures is not fruitful.

FIG. 4B is a chart showing a fault pattern for different faulted phases in a second plane based on a zero sequence and a negative sequence. Like in the first plane phase diagram of FIG. 4A, different zones in the second plane phase diagram ($\Delta V_2$-$\Delta V_0$) are associated with different faults. Now, instead of only relying on the first plane phase diagram, information from both these diagrams is combined to identify the likely faulted phase. Thus, if one of the phase diagrams of FIGS. 4A and 4B permits two different types of faults, the other of the phase diagrams may be used to further select the particular type of fault.

In embodiments, the present disclosure describes a method for detecting a fault in a power grid including a relay. The power grid may include a renewable power source. The method may include determining, by a controller, in response to the monitoring signal received from the relay, sequence voltages and sequence currents in the line. The controller may be controller 14 or any other suitable controller. The relay may be relay 12, IED 117, or any other suitable relay. Alternatively, the relay may perform functions described with reference to controller 14. The method may further include determining, by the controller, in response to the sequence voltages and sequence currents, an absence or a presence of a weak-infeed condition in the line. The method may further include determining, by the controller, in response to the monitoring signal and the absence or the presence of the weak-infeed condition, a first plane sequence signature and a second plane sequence signature. The method may further include determining, by the controller, a fault in the power grid in response to the first plane sequence signature and the second plane sequence signature. In embodiments, the first plane sequence signature may include positive and negative sequences, and wherein the second plane sequence signature may include zero and negative sequences.

In embodiments, the method may further include, by the controller, in response to the absence of the weak-infeed condition, determining the first plane sequence signature including a first plane current sequence signature based on a delta positive-sequence current and a delta negative-sequence current ($\Delta I_1$ and $\Delta I_2$); and determining the second plane sequence signature including a second plane current signature based on a delta zero-sequence current and the delta negative-sequence current ($\Delta I_0$ and $\Delta I_2$).

In embodiments, the method may further include, by the controller, in response to failure to determine the fault based on the first plane current signature ($\Delta I_1$ and $\Delta I_2$) and the second plane current signature ($\Delta I_0$ and $\Delta I_2$), determining the fault based on a first plane voltage sequence signature based on a delta positive-sequence voltage and a delta negative-sequence voltage ($\Delta V_1$ and $\Delta V_2$) and a second plane voltage sequence signature based on a delta zero-sequence voltage and the delta negative-sequence voltage ($\Delta V_0$ and $\Delta V_2$).

In embodiments, the method may further include, by the controller, in response to the presence of the weak-infeed condition, determining the first plane signature including a first plane voltage signature based on a delta positive-sequence voltage and a delta negative-sequence voltage ($\Delta V_1$ and $\Delta V_2$), and determining the second plane signature including a second plane voltage signature based on a delta zero-sequence voltage and the delta negative-sequence voltage ($\Delta V_0$ and $\Delta V_2$).

The method may further include, by the controller, in response to failure to determine the fault based on the first plane voltage signature ($\Delta V_1$ and $\Delta V_2$) and the second plane voltage signature ($\Delta V_0$ and $\Delta V_2$), determining the fault based on the first plane voltage sequence signature ($\Delta V_1$ and $\Delta V_2$) and a second plane current sequence signature based on a delta zero-sequence current and the delta negative-sequence current ($\Delta I_1$ and $\Delta I_2$).

The fault may include one or more of a single line-to-ground fault, a line-to-line fault, a line-to-line-to-ground fault, or a three-phase fault. The method may further include, by the controller, controlling the relay to perform a protective function based on the fault.

Turning back to FIG. 1, the controller 14 may be implemented by any suitable computer system. The controller 14 may include one or more processors 40 that execute instructions that are stored in one or more memory devices (referred to as memory 42). The instructions may be, for instance, instructions for implementing functionality described as being carried out by one or more modules and systems disclosed above or instructions for implementing one or more of the methods disclosed above. The one or more processors 40 may be embodied in, for example, a CPU, multiple CPUs, a GPU, multiple GPUs, a TPU, multiple TPUs, a multi-core processor, a combination thereof, and the like. In some embodiments, the one or more processors 40 may be arranged in a single processing device.

In other embodiments, the one or more processors 40 may be distributed across two or more processing devices (e.g., multiple CPUs; multiple GPUs; a combination thereof; or the like). A processor may be implemented as a combination of processing circuitry or computing processing units (such as CPUs, GPUs, or a combination of both). Therefore, for the sake of illustration, a processor can refer to a single-core processor; a single processor with software multithread execution capability; a multi-core processor; a multi-core processor with software multithread execution capability; a multi-core processor with hardware multithread technology; a parallel processing (or computing) platform; and parallel computing platforms with distributed shared memory. Additionally, or as another example, a processor can refer to an integrated circuit ($I_C$), an ASIC, a digital signal processor (DSP), an FPGA, a PLC, a complex programmable logic device (CPLD), a discrete gate or transistor logic, discrete hardware components, or any combination thereof designed or otherwise configured (e.g., manufactured) to perform the functions described herein.

The one or more processors 40 can access the memory 42 by means of a communication architecture 44 (e.g., a system bus). The communication architecture 44 may be suitable for the particular arrangement (localized or distributed) and types of the one or more processors 40. In some embodiments, the communication architecture 44 may include one or many bus architectures, such as a memory bus or a memory controller; a peripheral bus; an accelerated graphics port; a processor or local bus; a combination thereof, or the like. As an illustration, such architectures can include an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, a Peripheral Component Interconnect (PCI) bus, a PCI-Express bus, a Personal Computer Memory Card International Association (PCMCIA) bus, a Universal Serial Bus (USB), and/or the like.

Memory components or memory devices disclosed herein can be embodied in either volatile memory or non-volatile memory or can include both volatile and non-volatile memory. In addition, the memory components or memory devices can be removable or non-removable, and/or internal or external to a computing device or component. Examples of various types of non-transitory storage media can include hard-disc drives, zip drives, CD-ROMs, digital versatile disks (DVDs) or other optical storage, magnetic cassettes, magnetic tape, magnetic disk storage or other magnetic storage devices, flash memory cards or other types of memory cards, cartridges, or any other non-transitory media suitable to retain the desired information and which can be accessed by a computing device.

As an illustration, non-volatile memory can include read-only memory (ROM), programmable ROM (PROM), electrically programmable ROM (EPROM), electrically erasable programmable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The disclosed memory devices or memories of the operational or computational environments described herein are intended to include one or more of these and/or any other suitable types of memory. In addition to storing executable instructions, the memory 42 also can retain data.

A controller 14 may include mass storage 48 that is accessible by the one or more processors 40 by means of the communication architecture 44. The mass storage 48 may include machine-accessible instructions (e.g., computer-readable instructions and/or computer-executable instructions). In some embodiments, the machine-accessible instructions may be encoded in the mass storage 48 and can be arranged in components that can be built (e.g., linked and compiled) and retained in computer-executable form in the mass storage 48 or in one or more other machine-accessible non-transitory storage media included in the controller 14. Such components can embody, or can constitute, one or many of the various modules disclosed herein. Additionally, protocols such as Modbus, DNP, IEC 60870, IEC 61850, Profibus, Fieldbus, etc. may be used in conjunction with the systems and methods described herein.

Execution of the modules, individually or in combination, by the one more processors 40, can cause the controller 14 to perform any of the operations described herein (for example, the operations described with respect to FIGS. 1 to 4B, as well as any other operations).

A controller 14 also can include one or more interface devices 50, which may include one or both of an input/output interface or a network interface that can permit or otherwise facilitate external devices to communicate with the controller 14. For instance, the interface 50 may be used to receive and send data and/or instructions from and to an external computing device.

The network interface devices may permit or otherwise facilitate functionally coupling the controller 14 with one or more external devices. Functionally coupling the controller 14 to an external device may include establishing a wireline connection or a wireless connection between the controller 14 and the external device. The network interface devices may include one or many antennas and a communication processing device that can permit wireless communication between the controller 14 and another external device. For example, between a vehicle and a smart infrastructure system, between two smart infrastructure systems, etc. Such a communication processing device can process data according to defined protocols of one or several radio technologies. The radio technologies can include, for example, 3G, Long Term Evolution (LTE), LTE-Advanced, 4G, 5G, IEEE 802.11, IEEE 802.16, Bluetooth, ZigBee, near-field communication (NFC), and the like. The communication processing device can also process data according to other protocols as well, such as vehicle-to-infrastructure (V2I) communications, vehicle-to-vehicle (V2V) communications, and the like. The network interfaces may also be used to facilitate peer-to-peer ad-hoc network connections as described herein.

As used in this application, the terms "environment," "system," "unit," "module," "architecture," "interface," "component," and the like refer to a computer-related entity or an entity related to an operational apparatus with one or more defined functionalities. The terms "environment," "system," "module," "component," "architecture," "interface," and "unit," can be utilized interchangeably and can be generically referred to functional elements. Such entities may be either hardware, a combination of hardware and software, software, or software in execution. As an example, a module may be embodied in a process running on a processor, a processor, an object, an executable portion of software, a thread of execution, a program, and/or a computing device. As another example, both a software application executing on a computing device and the computing device can embody a module. As yet another example, one or more modules may reside within a process and/or thread of execution. A module may be localized on one computing device or distributed between two or more computing devices. As is disclosed herein, a module can execute from various computer-readable non-transitory storage media having various data structures stored thereon. Modules may communicate via local and/or remote processes in accordance, for example, with a signal (either analogic or digital) having one or more data packets (e.g., data from one component interacting with another component in a local system, distributed system, and/or across a network such as a wide area network with other systems via the signal).

As yet another example, a module may be embodied in or can include an apparatus with a defined functionality provided by mechanical parts operated by electric or electronic circuitry that is controlled by a software application or firmware application executed by a processor. Such a processor can be internal or external to the apparatus and can execute at least part of the software or firmware application. Still, in another example, a module can be embodied in or can include an apparatus that provides defined functionality through electronic components without mechanical parts. The electronic components can include a processor to execute software or firmware that permits or otherwise facilitates, at least in part, the functionality of the electronic components.

In some embodiments, modules can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, modules can communicate or otherwise be coupled via thermal, mechanical, electrical, and/or electromechanical coupling mechanisms (such as conduits, connectors, combinations thereof, or the like). An interface can include input/output (I/O) components as well as associated processors, applications, and/or other programming components.

Further, in the present specification and annexed drawings, terms such as "store," "storage," "data store," "data storage," "memory," "repository," and substantially any other information storage component relevant to the operation and functionality of a component of the disclosure, refer to memory components, entities embodied in one or several memory devices, or components forming a memory device. It is noted that the memory components or memory devices described herein embody or include non-transitory computer storage media that can be readable or otherwise accessible by a computing device. Such media can be implemented in any methods or technology for storage of information, such as machine-accessible instructions (e.g., computer-readable instructions), information structures, program modules, or other information objects.

We claim:

1. A system for detecting a fault type and faulted phase using two planes in a power grid, the system comprising:
   a relay configured to monitor a line of the power grid by measuring three-phase voltages and three-phase currents and generate a monitoring signal; and
   a controller, wherein the controller is configured to:
     determine three-phase voltage phasors and three-phase current phasors, in response to three-phase voltages and three-phase current samples acquired from current and voltage instrument transformers;
     determine a positive sequence voltage, a negative sequence voltage, a zero sequence voltage, and voltage magnitudes in response to phasors of the three-phase voltages;
     determine a positive sequence current, a negative sequence current, a zero sequence current, and current magnitudes in response to phasors of the three-phase currents;
     capture positive, negative, and zero sequence voltage phasors, positive, negative, and zero current phasors, positive, negative, and zero sequence voltage magnitudes, and positive, negative, and zero sequence current magnitudes;
     determine, in response to the negative sequence current magnitude, an absence or a presence of a weak-infeed condition in the line;
     determine, in response to the positive, negative, and zero sequence current magnitudes and to the positive, negative, and zero sequence voltage magnitudes, an enabling signal;
     determine a delta change in the positive, negative, and zero sequence voltage phasors and a delta change in the positive, negative, and zero sequence current phasors, in response to the positive, negative, and zero sequence voltage phasors, in response to the positive, negative, and zero sequence current phasors, in response to the positive, negative, and zero sequence voltage phasors, and in response to the positive, negative, and zero sequence current phasors;
     determine, in response to a first angle between a pair of delta change sequence quantities in a first of the two planes, a first plane sequence signature;
     determine, in response to a second angle between two delta change sequence quantities in a second of the two planes, a second plane sequence signature;
     determine an initial fault type and faulted phase in the power grid in response to the enabling signal, the first plane sequence signature, and the second plane sequence signature; and
     determine a final fault type and faulted phase in the power grid, in response to the initial fault type and faulted phase, and the voltage magnitudes.

2. The system of claim 1, wherein the first angle is between delta positive and delta negative voltage or current sequences, and wherein the second angle is between delta zero and delta negative voltage or current sequences.

3. The system of claim 1, wherein the controller is further configured to, in response to the absence of the weak-infeed condition:
   determine the first plane sequence signature comprising a first plane current sequence signature based on the first angle, wherein the first angle is between a delta positive current sequence and a delta negative-sequence current ($\Delta I_1$ and $\Delta I_2$);
   determine the second plane sequence signature comprising a second plane current signature based on the second angle, wherein the second angle is between a delta zero current sequence and the delta negative-sequence current ($\Delta I_0$ and $\Delta I_2$);
   determine a fault type and faulted phase in the first plane based on the first plane sequence signature and first plane sectors, wherein each plane sector in the first plane is defined by a first angle range;

determine a fault type and faulted phase in the second plane based on the second plane sequence signature and second plane sectors, wherein each plane sector in the second plane is defined by a second angle range; and determine the final fault type and faulted phase based on the fault type and faulted phase in the first plane, the fault type and faulted phase in the second plane, and the enabling signal.

4. The system of claim 3, wherein the controller is further configured to, in response to a failure to determine the final fault type and faulted phase based on a first plane current signature ($\Delta I_1$ and $\Delta I_2$) and a second plane current signature ($\Delta I_0$ and $\Delta I_2$):

determine the first plane sequence signature comprising a first plane voltage sequence signature based on the first angle, wherein the first angle is between a delta positive sequence voltage and a delta negative-sequence voltage ($\Delta V_1$ and $\Delta V_2$);

determine the second plane sequence signature comprising a second plane voltage signature based on the second angle, wherein the second angle is between the delta negative sequence voltage and a delta zero-sequence voltage ($\Delta V_0$ and $\Delta V_2$);

determine a fault type and faulted phase in the first plane based on the first plane sequence signature and first plane sectors, wherein each of the first plane sectors is defined by a first angle range that is pre-defined, settable, or adaptive;

determine a fault type and faulted phase in the second plane based on the second plane sequence signature and second plane sectors, wherein each of the second plane sectors is defined by a second angle range that is pre-defined, settable, or adaptive; and determine the final fault type and faulted phase based on the fault type and faulted phase in the first plane, the fault type and faulted phase in the second plane, and the enabling signal.

5. The system of claim 1, wherein the controller is configured to, in response to the presence of the weak-infeed condition or a presence of a non-synchronous generation:

determine the first plane sequence signature comprising a first plane voltage signature based on the first angle, wherein the first angle is between a delta positive-sequence voltage and a delta negative-sequence voltage ($\Delta V_1$ and $\Delta V_2$);

determine the second plane sequence signature comprising a second plane voltage signature based on the second angle, wherein the second angle is between a delta zero-sequence voltage and the delta negative-sequence voltage ($\Delta V_0$ and $\Delta V_2$);

determine a fault type and faulted phase in the first plane based on the first plane sequence signature and first plane sectors, wherein each of the first plane sectors is defined by a first angle range that is pre-defined, settable, or adaptive;

determine a fault type and faulted phase in the second plane based on the second plane sequence signature and second plane sectors, wherein each of the second plane sectors is defined by a second angle range that is pre-defined, settable, or adaptive; and determine the initial fault type and faulted phase based on the fault type and faulted phase in the first plane, the fault type and faulted phase in the second plane, and the enabling signal.

6. The system of claim 5, wherein the controller is further configured to, in response to failure to determine the initial fault type and faulted phase based on a first plane voltage signature ($\Delta V_1$ and $\Delta V_2$) and a second plane voltage signature ($\Delta V_0$ and $\Delta V_2$):

determine the first plane sequence signature comprising a first plane voltage sequence signature based on the first angle, wherein the first angle is between a delta positive sequence voltage and a delta negative-sequence voltage ($\Delta V_1$ and $\Delta V_2$);

determine the second plane sequence signature comprising a second plane current signature based on the second angle, wherein the first angle is between a delta positive sequence current and a delta negative-sequence current ($\Delta I_0$ and $\Delta I_2$);

determine the fault type and faulted phase in the first plane based on the first plane sequence signature and first plane sectors, wherein each of the first plane sectors is defined by a first angle range that is pre-defined, settable, or adaptive;

determine the fault type and faulted phase in the second plane based on the second plane sequence signature and second plane sectors, wherein each of the second plane sectors is defined by a second angle range that is pre-defined, settable, or adaptive; and determine the final fault type and faulted phase based on the fault type and faulted phase in the first plane, the fault type and faulted phase in the second plane, and the enabling signal.

7. The system of claim 1, wherein the fault comprises one or more of a single line-to-ground fault, a line-to-line fault, a line-to-line-to-ground fault, or a three-phase fault.

8. The system of claim 1, wherein the controller is configured to control the relay to perform a protective function based on the fault.

9. The system of claim 1, wherein the relay comprises the controller.

10. The system of claim 1, wherein the power grid comprises a renewable energy source.

11. The system of claim 1, wherein the controller is further configured to:

determine that the weak-infeed condition is present based on the negative sequence current magnitude compared to a first threshold that is fixed, relative, or settable; and determine that the enabling signal is present based on the positive, negative, and zero sequence voltage and current magnitudes compared to a second threshold.

12. A method for detecting a fault type and faulted phase using two planes in a power grid comprising a relay configured to monitor a line of the power grid and generate a monitoring signal, the method comprising:

determining, by a controller, three phase voltage phasors and three phase current phasors, in response to three-phase voltages and three-phase currents acquired from current and voltage instrument transformers;

determining, by the controller, a positive sequence voltage, a negative sequence voltage, a zero sequence voltage, and voltage magnitudes in response to phasors of the three-phase voltages;

determining, by the controller, a positive sequence current, a negative sequence current, a zero sequence current, and current magnitudes in response to phasors of the three-phase currents;

identifying, by the controller, positive, negative, and zero sequence voltage phasors, positive, negative, and zero current phasors, positive, negative, and zero sequence voltage magnitudes, and positive, negative, and zero sequence current magnitudes;

determining, by the controller, in response to the negative sequence current magnitude, an absence or a presence of a weak-infeed condition in the line;

determining, by the controller, in response to the positive, negative, and zero sequence current magnitudes and to the positive, negative, and zero sequence voltage magnitudes, an enabling signal;

determining, by the controller, a delta change in the positive, negative, and zero sequence voltage phasors and a delta change in the positive, negative, and zero sequence current phasors, in response to the positive, negative, and zero sequence voltage phasors, in response to the positive, negative, and zero sequence current phasors, in response to the positive, negative, and zero sequence voltage phasors, and in response to the positive, negative, and zero sequence current phasors;

determining, by the controller, in response to a first angle between a pair of delta change sequence quantities in a first of the two planes, a first plane sequence signature;

determining, by the controller, in response to a second angle between two delta change sequence quantities in a second of the two planes, a second plane sequence signature;

determining, by the controller, an initial fault type and faulted phase in the power grid in response to the enabling signal, the first plane sequence signature, and the second plane sequence signature; and determining, by the controller, a final fault type and faulted phase in the power grid, in response to the initial fault type and faulted phase, and the voltage magnitudes.

13. The method of claim 12, wherein the first angle is between delta positive and delta negative voltage or current sequences, and wherein the second angle is between delta zero and delta negative voltage or current sequences.

14. The method of claim 12, further comprising, by the controller, in response to the absence of the weak-infeed condition:

determining the first plane sequence signature comprising a first plane current sequence signature based on the first angle, wherein the first angle is between a delta positive-sequence current and a delta negative-sequence current ($\Delta I_1$ and $\Delta I_2$);

determining the second plane sequence signature comprising a second plane current signature based on the second angle, wherein the second angle is between a delta zero-sequence current and the delta negative-sequence current ($\Delta I_0$ and $\Delta I_2$);

determining a fault type and faulted phase in the first plane based on the first plane sequence signature and first plane sectors, wherein each plane sector in the first plane is defined by a first angle range;

determining a fault type and faulted phase in the second plane based on the second plane sequence signature and second plane sectors, wherein each plane sector in the second plane is defined by a second angle range; and determining the final fault type and faulted phase based on the fault type and faulted phase in the first plane, the fault type and faulted phase in the second plane, and the enabling signal.

15. The method of claim 14, further comprising, by the controller, in response to a failure to determine the final fault type and faulted phase based on a first plane current signature ($\Delta I_1$ and $\Delta I_2$) and a second plane current signature ($\Delta I_0$ and $\Delta I_2$):

determining the first plane sequence signature comprising a first plane voltage sequence signature based on the first angle, wherein the first angle is between a delta positive sequence voltage and a delta negative-sequence voltage ($\Delta V_1$ and $\Delta V_2$);

determine the second plane sequence signature comprising a second plane voltage signature based on the second angle, wherein the second angle is between the delta negative sequence voltage and a delta zero-sequence voltage ($\Delta V_0$ and $\Delta V_2$);

determine a fault type and faulted phase in the first plane based on the first plane sequence signature and first plane sectors, wherein each of the first plane sectors is defined by a first angle range that is pre-defined, settable, or adaptive;

determine a fault type and faulted phase in the second plane based on the second plane sequence signature and second plane sectors, wherein each of the second plane sectors is defined by a second angle range that is pre-defined, settable, or adaptive; and determine the final fault type and faulted phase based on the fault type and faulted phase in the first plane, the fault type and faulted phase in the second plane, and the enabling signal.

16. The method of claim 12, further comprising, by the controller, in response to the presence of the weak-infeed condition or a presence of a non-synchronous generation:

determining the first plane sequence signature comprising a first plane voltage signature based on the first angle, wherein the first angle is between a delta positive-sequence voltage and a delta negative-sequence voltage ($\Delta V_1$ and $\Delta V_2$);

determining the second plane sequence signature comprising a second plane voltage signature based on the second angle, wherein the second angle is between a delta zero-sequence voltage and the delta negative-sequence voltage ($\Delta V_0$ and $\Delta V_2$);

determining a fault type and faulted phase in the first plane based on the first plane sequence signature and first plane sectors, wherein each of the first plane sectors is defined by a first angle range that is pre-defined, settable, or adaptive;

determining a fault type and faulted phase in the second plane based on the second plane sequence signature and second plane sectors, wherein each of the second plane sectors is defined by a second angle range that is pre-defined, settable, or adaptive; and determining the initial fault type and faulted phase based on the fault type and faulted phase in the first plane, the fault type and faulted phase in the second plane, and the enabling signal.

17. The method of claim 16, further comprising, by the controller, in response to failure to determine the initial fault type and faulted phase based on a first plane voltage signature ($\Delta V_1$ and $\Delta V_2$) and a second plane voltage signature ($\Delta V_0$ and $\Delta V_2$):

determining the first plane sequence signature comprising a first plane voltage sequence signature based on the first angle, wherein the first angle is between a delta positive sequence voltage and a delta negative-sequence voltage ($\Delta V_1$ and $\Delta V_2$);

determining the second plane sequence signature comprising a second plane current signature based on the second angle, wherein the first angle is between a delta positive sequence current and a delta negative-sequence current ($\Delta I_0$ and $\Delta I_2$);

determining the fault type and faulted phase in the first plane based on the first plane sequence signature and first plane sectors, wherein each of the first plane sectors is defined by a first angle range that is pre-defined, settable, or adaptive;

determining the fault type and faulted phase in the second plane based on the second plane sequence signature and second plane sectors, wherein each of the second plane sectors is defined by a second angle range that is pre-defined, settable, or adaptive; and determining the final fault type and faulted phase based on the fault type and faulted phase in the first plane, the fault type and faulted phase in the second plane, and the enabling signal.

18. The method of claim 12, wherein the fault comprises one or more of a single line-to-ground fault, a line-to-line fault, a line-to-line-to-ground fault, or a three-phase fault.

19. The method of claim 12, further comprising, by the controller, controlling the relay to perform a protective function based on the fault.

20. The method of claim 12, wherein the power grid comprises a renewable energy source.

* * * * *